(12) United States Patent
Hamaguchi

(10) Patent No.: US 10,514,448 B2
(45) Date of Patent: Dec. 24, 2019

(54) PROXIMITY SENSOR, PROXIMITY ILLUMINATION INTENSITY SENSOR, ELECTRONIC DEVICE, AND PROXIMITY SENSOR CALIBRATION METHOD

(71) Applicant: SHARP KABUSHIKI KAISHA, Sakai, Osaka (JP)

(72) Inventor: Kohji Hamaguchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/301,709

(22) PCT Filed: Mar. 9, 2017

(86) PCT No.: PCT/JP2017/009401
§ 371 (c)(1),
(2) Date: Nov. 14, 2018

(87) PCT Pub. No.: WO2017/199550
PCT Pub. Date: Nov. 23, 2017

(65) Prior Publication Data
US 2019/0285735 A1 Sep. 19, 2019

(30) Foreign Application Priority Data
May 17, 2016 (JP) .................. 2016-099006

(51) Int. Cl.
*G01S 17/10* (2006.01)
*G01S 7/497* (2006.01)
(Continued)

(52) U.S. Cl.
CPC ............ *G01S 7/497* (2013.01); *G01S 17/026* (2013.01); *G01S 17/10* (2013.01); *H03K 17/945* (2013.01)

(58) Field of Classification Search
CPC ........ G01S 17/026; G01S 7/497; G01S 17/36; G01S 13/42; G01S 7/4918; G01S 13/0209; G01S 13/04; G01S 13/34; G01S 13/66; G01S 13/883; G01S 13/89; G01S 13/93; G01S 15/93; G01S 17/08; G01S 17/48; G01S 17/93; G01S 7/411; G01S 7/412; G01S 7/4913; G01S 7/4915; G01S 11/06; G01S 13/36; G01S 13/56; G01S 13/92;
(Continued)

(56) References Cited

U.S. PATENT DOCUMENTS 7,486,386 B1\* 2/2009 Holcombe ............... G01C 3/08
356/4.01
9,612,330 B2\* 4/2017 Parodi-Keravec ....... G01V 8/14
(Continued)

FOREIGN PATENT DOCUMENTS

JP 2013-118565 A 6/2013

*Primary Examiner* — Michael P Stafira
(74) *Attorney, Agent, or Firm* — ScienBiziP, P.C.

(57) ABSTRACT

A proximity sensor includes: a light emitting unit that emits light; a light receiving unit that generates measurement current which includes object reflected light current and non-detection-target-object reflected light current; and an initial calibration execution unit that updates, on the basis of a value of the measurement current, an offset value according to the non-detection-target-object reflected light current, in a case where the value of the measurement current is equal to or less than an initial threshold.

15 Claims, 11 Drawing Sheets

(51) Int. Cl.
*G01S 17/02* (2006.01)
*H03K 17/945* (2006.01)

(58) Field of Classification Search
CPC .......... G01S 17/06; G01S 17/32; G01S 17/87;
G01S 17/936; G01S 5/0252; G01S 5/14;
G01S 7/481; G01S 7/4815; G01B 21/16;
G01B 7/14; G01B 7/023; G01B 7/003;
G01B 11/14; G01B 11/22; G01J 1/4228;
G01J 1/44; G01J 3/2803; G01J 1/32;
G01N 27/3273; G01N 27/3274; G01N
33/66; G01N 2291/021; G01N 29/2418;
G01N 29/30; G01N 2021/8835; G01N
21/3577; G01N 21/51; G01N 21/85;
G01N 21/8806; G01N 21/8851; G01N
21/89; G01N 27/06; G01N 33/04; G01N
33/487; G01N 27/3272; G02B 27/017;
G02B 19/0042; G02B 19/0052; G02B
19/0061; G02B 2027/0178; G02B
2027/0187; G02B 27/0093; G02B
27/0179; G02B 6/00; G02B 6/0068;
G02B 6/0073; G02B 6/0078; G02B
27/2258; G02B 27/2292; G02B 5/32
See application file for complete search history.

(56) References Cited

U.S. PATENT DOCUMENTS

| 9,697,643 B2 * | 7/2017 | Holz | G06K 9/3233 |
| 2010/0102230 A1 * | 4/2010 | Chang | G01J 1/32 |
| | | | 250/338.4 |
| 2015/0378013 A1 * | 12/2015 | Bikumandla | G01S 17/026 |
| | | | 250/201.1 |
| 2016/0057578 A1 * | 2/2016 | Rouaissia | G01B 7/14 |
| | | | 455/456.1 |
| 2016/0077337 A1 * | 3/2016 | Raffle | G06F 3/013 |
| | | | 345/156 |
| 2016/0116592 A1 * | 4/2016 | Hiromi | G06F 3/0304 |
| | | | 345/156 |
| 2019/0273909 A1 * | 9/2019 | Ye | H04N 13/289 |

* cited by examiner

500: MOBILE PHONE  502: DISPLAY UNIT
501: PROXIMITY SENSOR
    (PROXIMITY ILLUMINATION INTENSITY SENSOR)

600: DIGITAL CAMERA
601: PROXIMITY SENSOR
    (PROXIMITY ILLUMINATION INTENSITY SENSOR)
602: DISPLAY UNIT

PROXIMITY SENSOR, PROXIMITY ILLUMINATION INTENSITY SENSOR, ELECTRONIC DEVICE, AND PROXIMITY SENSOR CALIBRATION METHOD

TECHNICAL FIELD

The present invention relates to a proximity sensor and a proximity illumination intensity sensor that detect proximity of a detection object.

BACKGROUND ART

In recent years, mobile devices (electronic devices, more specifically, portable electronic devices) that include a screen (for example, liquid crystal screen) with a touch panel and are represented by mobile phones, smartphones, and media players, have been widely used. The mobile devices are in the process of becoming more multi-functioned, more compact, or thinner, and some of the mobile devices equipped with a proximity sensor that detects (senses) whether or not there is an object in proximity thereto are put on the market.

A proximity sensor and a calibration method thereof according to the related art are described with reference to FIGS. 8 to 11. FIG. 8 is a view for explaining an operation principle of a proximity sensor 900 of the related art. FIG. 9 is a view for explaining a problem of the proximity sensor 900. FIG. 10 is a functional block diagram illustrating a schematic configuration of the proximity sensor 900. FIG. 11 is a flowchart illustrating an example of a flow of calibration processing of the proximity sensor 900. Note that, LED light emission P in FIG. 9 indicates a pulse signal for causing a light emitting unit 901 to emit light.

There are proximity sensors of various systems as the proximity sensor 900 of the related art, and a proximity sensor 900 of a light detection system is used in many cases in a small-sized mobile terminal such as a mobile phone or a media player. As illustrated in FIG. 8, the proximity sensor 900 of the light detection system causes outgoing light L1 emitted from the light emitting unit 901 in the proximity sensor 900 to be reflected by an object OB and receives reflected light L2 by a light receiving unit 902 in the proximity sensor 900 to thereby determine that the object is in proximity.

Such proximity sensor 900 of the light detection system is often used by being incorporated in a housing 960 of a mobile phone 950 as illustrated in FIGS. 9 and 10. In this case, the outgoing light L1 emitted from the light emitting unit 901 may be reflected by the housing 960 and reflected light L3 from the housing 960 may be received by the light receiving unit 902 in some cases.

Here, an amount of the reflected light L3 when the outgoing light L1 emitted from the light emitting unit 901 is reflected by the housing 960 varies depending on individual mobile phones or use environments thereof. Thus, when the light receiving unit 902 receives the reflected light L3 from the housing 960, a detected distance may have an error or an erroneous operation may be caused due to the variation of the amount of the reflected light L3 based on the individuals.

Under such circumstances, it is strongly desired to realize a proximity sensor (object detecting device) that has similar characteristics under various mounting conditions. Note that, an example of an index indicating the characteristics includes a detection distance (a distance between an object to be detected and the proximity sensor, by which it is determined that the object to be detected is in proximity) or a rate of occurrence of an erroneous operation.

Note that, factors that vary the amount of the reflected light L3 depending on individuals of the mobile phone 950 or use environments thereof are considered to be as follows. That is, a cause in a manufacturing process when the mobile phone 950 is shipped from a plant, contamination or change of an inner structure of the mobile terminal 950 due to degradation over time, conditions (mounting conditions of the proximity sensor) such as a position where the proximity sensor 900 is mounted in the mobile phone 950 and a shape of a surface of the housing of the mobile phone 950, in which the proximity sensor 900 has been mounted, and the like vary among manufacturers and models. As a reason therefor, restriction on a physical appearance and a design of the mobile phone 950 (electronic device) is cited.

There has been a calibration method by a proximity sensor as a countermeasure to prevent an erroneous operation due to the reflected light L3 from the housing 960, and an example thereof is described in PTL 1.

An outline of a calibration method similar to the calibration method described in PTL 1 is described with reference to FIGS. 10 and 11.

Specifically, the mobile phone 950 includes the proximity sensor 900, a mobile control unit 951, and a display unit 952. The proximity sensor 900 includes the light emitting unit 901, the light receiving unit 902, an analog-to-digital conversion unit 903, a storage unit 904, and a sensor control unit 910.

The light emitting unit 901 is an infrared LED (light emitting diode) that receives current supplied from the sensor control unit 910 and emits infrared rays. The light receiving unit 902 receives the infrared rays (reflected light L2) emitted from the light emitting unit 901 and reflected by the object OB and generates current according to an amount of light received by photoelectric conversion. The generated current is output to the analog-to-digital conversion unit 903.

In the storage unit 904, a predetermined threshold is stored in advance, and the stored threshold is read by the sensor control unit 910 and the stored threshold is updated by the sensor control unit 910.

The analog-to-digital conversion unit 903 performs AD conversion (analog-to-digital conversion) on the current output from the light receiving unit 902 and outputs a value represented by a digital signal to the sensor control unit 910.

Every time outgoing/incoming call information indicating an outgoing call from the mobile phone 950 or an incoming call to the mobile phone 950 is input from the mobile control unit 951, the sensor control unit 910 supplies current to the light emitting unit 901 to cause the light emitting unit 901 to emit light. At this time, the sensor control unit 910 generates a new threshold in accordance with a current value output from the analog-to-digital conversion unit 903 and updates the threshold to be stored in the threshold storage unit 904. Such processing in sequence is referred to as calibration.

The sensor control unit 910 performing the calibration causes the light emitting unit 901 to emit light, compares the current value output from the analog-to-digital conversion unit 903 and the threshold (when the threshold has been updated, the updated threshold) read from the storage unit 904, and detects proximity of a user in accordance with a comparison result. When detecting proximity of the user, the sensor control unit 910 outputs detection information to the mobile control unit 951.

That is, every time there is an outgoing call from or an incoming call to the mobile phone 950, the proximity sensor 900 measures noise floor, performs the calibration, and then, detects proximity of an object (user), and outputs detection information indicating the proximity, to the mobile control unit 951 of the mobile phone 950. In a case where the detection information indicating the proximity of the user is input from the proximity sensor 900, the control unit 951 performs control, for example, to turn off a function of a touch panel and turn off display of the display unit 952.

Next, an example of a flow of calibration processing of the proximity sensor 900 is described with reference to FIG. 11.

First, the sensor control unit 910 determines whether or not outgoing/incoming call information is acquired from the mobile control unit 951 of the mobile phone 950 (S1001). When the outgoing/incoming call information is acquired (YES at S1001), the sensor control unit 910 supplies current to the light emitting unit 901 to cause the light emitting unit 901 to emit light (S1002), generates a new threshold in accordance with a current value output from the analog-to-digital conversion unit 903, and updates a threshold stored in the storage unit 904 (S1003). Calibration processing performed by the proximity sensor 900 when there is an outgoing call from or an incoming call to the mobile phone 950, that is, when the proximity sensor 900 is activated is indicated by S1001 to S1003. Note that, in a case where the outgoing/incoming call information is not acquired (NO at S1001), the procedure returns to S1001 to determine acquisition of the outgoing/incoming call information.

Next, the sensor control unit 910 supplies current to the light emitting unit 901 to cause the light emitting unit 901 to emit light (S1004), compares the current value output from the analog-to-digital conversion unit 903 and the threshold read from the storage unit 904, and determines whether or not the current value is equal to or higher than the threshold (S1005). In a case where the current value is equal to or higher than the threshold (YES at S1005), the sensor control unit 910 determines that a detection target in proximity is detected (S1006) and outputs detection information to the mobile control unit 951. In a case where the current value is less than the threshold (NO at S1005), the sensor control unit 910 determines that a detection target is in no proximity (S1007), and ends the processing.

As a result, by performing the calibration of the proximity sensor 900 when there is an outgoing call from or an incoming call to the mobile phone 950, for example, even when noise floor changes due to various external factors in an adjustment step before shipment from a plant, due to change in an inner structure over time, or the like, proximity of the user is able to be correctly detected.

CITATION LIST

Patent Literature

PTL 1: Japanese Unexamined Patent Application Publication No. 2013-118565 (published on Jun. 13, 2013)

SUMMARY OF INVENTION

Technical Problem

However, the related art as described above has the following problem. That is, as a use example of a mobile phone, there may be a case where a detection target is in proximity to a front surface of the mobile phone at a time of an outgoing call or an incoming call. For example, in a case where there is an outgoing call or an incoming call, while the user operates the mobile phone, while the mobile phone is put in a pocket, a bag, or the like, or while a casing with a cover is being used, calibration processing is performed in a state where there is a detection target in proximity. As a result, there is a problem that the threshold to be stored in the storage unit 904 increases, and even when there is a detection target in proximity after that, the proximity of the detection target is difficult to be detected, and, for example, when the mobile phone is held at a face without turning off a function of a touch panel, the touch panel may react and the mobile phone may erroneously be operated.

The invention is made in view of the aforementioned problem and an object thereof is to realize a proximity sensor capable of correctly detecting proximity by optimally executing calibration.

Solution to Problem

In order to solve the aforementioned problem, a proximity sensor according to an aspect of the invention includes: a light emitting unit that emits light; a light receiving unit that generates measurement current which includes object reflected light current according to a received amount of reflected light that is emitted from the light emitting unit and reflected by a detection target object and non-detection-target-object reflected light current according a received amount of light other than the reflected light; and a first execution unit that executes first calibration in which an offset value according to a current value of the non-detection-target-object reflected light current is updated on a basis of a current value of the measurement current in a case where the current value of the measurement current is equal to or less than an initial threshold, and the offset value is not updated in a case where the current value of the measurement current is higher than the initial threshold.

In order to solve the aforementioned problem, a proximity sensor calibration method according to an aspect of the invention includes: a light emitting step of emitting light; a light receiving step of generating measurement current which includes object reflected light current according to a received amount of reflected light that is emitted at the light emitting step and reflected by a detection target object and non-detection-target-object reflected light current according a received amount of light other than the reflected light; and a first execution step of executing first calibration in which an offset value according to a current value of the non-detection-target-object reflected light current is updated on a basis of a current value of the measurement current in a case where the current value of the measurement current is equal to or less than an initial threshold, and the offset value is not updated in a case where the current value of the measurement current is higher than the initial threshold.

Advantageous Effects of Invention

According to an aspect of the invention, it is possible to enable a proximity sensor capable of correctly detecting proximity by optimally executing calibration.

DESCRIPTION OF EMBODIMENTS

Embodiment 1

Figure 1:
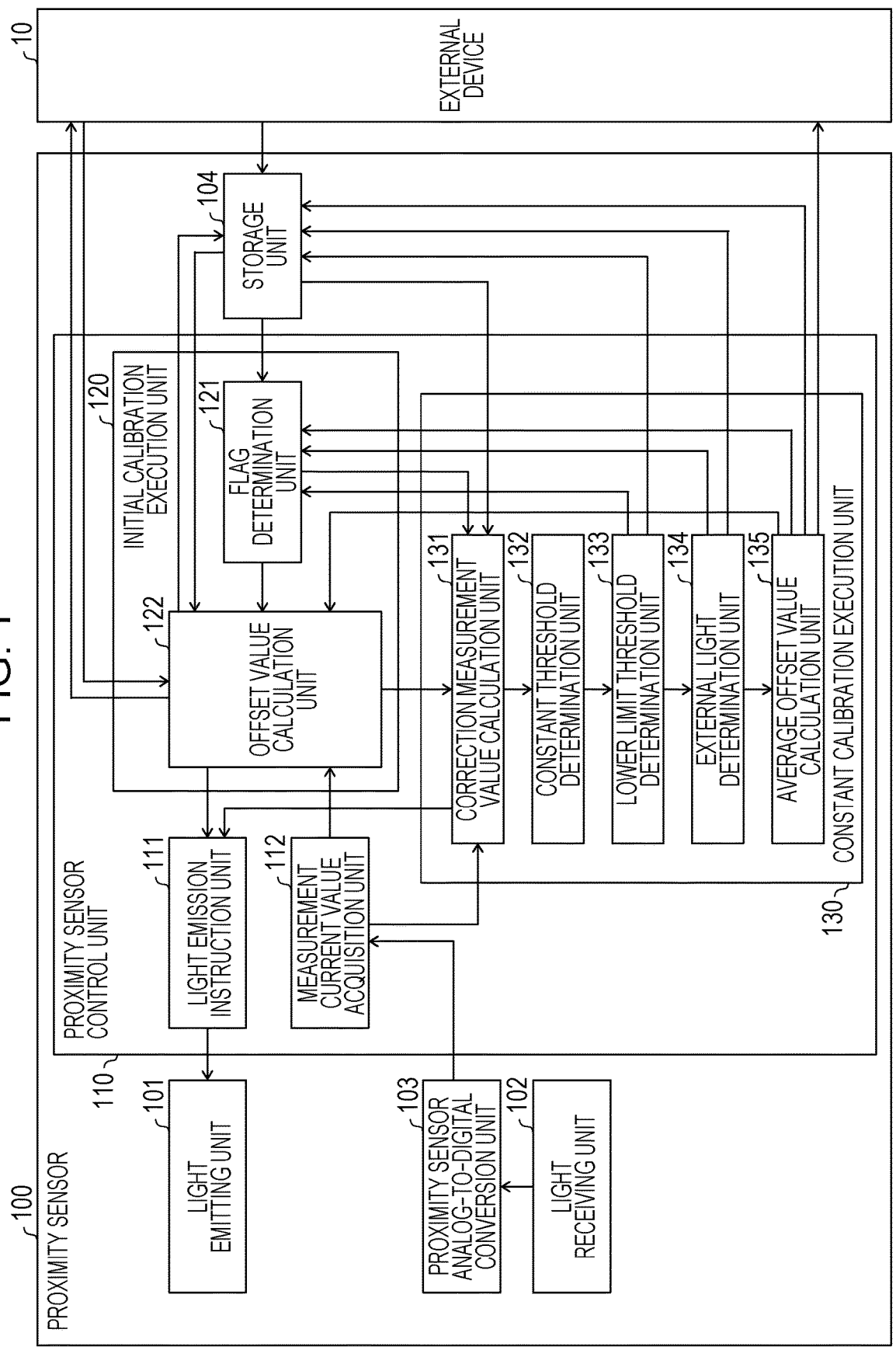
FIG. 1 is a functional block diagram illustrating a schematic configuration of a proximity sensor according to Embodiment 1 of the invention.
Figure 2:
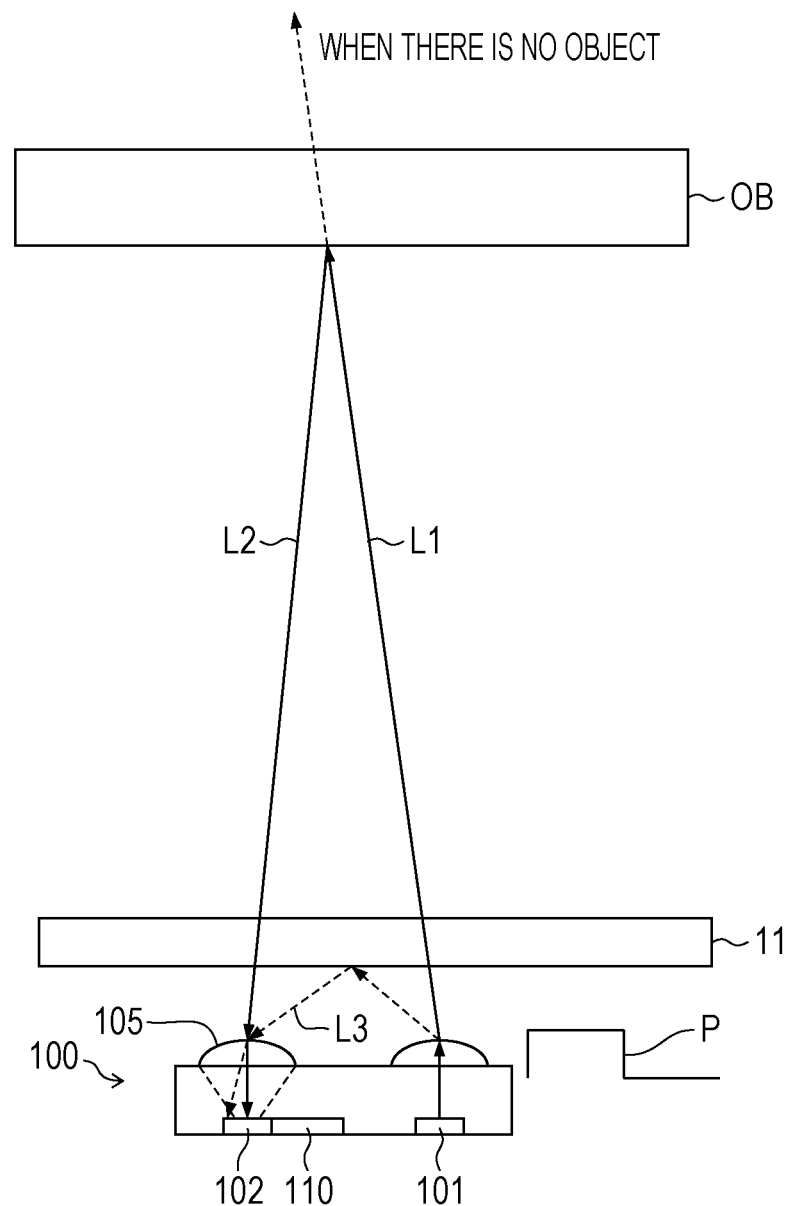
FIG. 2 is a view for explaining an operation principle of the proximity sensor.

Embodiment 1 of the invention is described with reference to FIGS. 1 to 4. FIG. 1 is a functional block diagram illustrating a schematic configuration of a proximity sensor 100 according to Embodiment 1 of the invention. FIG. 2 is a view for explaining an operation principle of the proximity sensor 100. Note that, LED light emission P of FIG. 2 indicates a pulse signal for causing a light emitting unit 101 to emit light.

(Configuration of Proximity Sensor)

The proximity sensor 100 includes the light emitting unit 101, a light receiving unit 102, a proximity sensor analog-to-digital conversion unit 103, a storage unit 104, a cover 105, and a proximity sensor control unit 110, as illustrated in FIGS. 1 and 2.

The light emitting unit 101 emits light. Specifically, the light emitting unit 101 receives current supplied from a light emission instruction unit 111 described below and emits light. As the light emitting unit 101, for example, an infrared LED that emits infrared rays is able to be used.

The light receiving unit 102 generates measurement current that includes detection-target-object reflected light current (hereinafter, referred to as object reflected light current) according to a received amount of reflected light that is emitted from the light emitting unit 101 and reflected by a detection target object (object OB) and non-detection-target-object reflected light current according to a received amount of light other than the reflected light.

Specifically, for example, outgoing light L1 emitted from the light emitting unit 101 is output to outside of the proximity sensor 100 as illustrated in FIG. 2. When the object OB is near the proximity sensor 100, the outgoing light L1 is reflected by the object OB. Reflected light L2 that is reflected by the object OB is incident on the proximity sensor 100 and received by the light receiving unit 102.

The light receiving unit 102 is constituted by a photodiode or the like, and detects light to thereby generate measurement current. The measurement current includes object reflected light current according to a received amount of reflected light L2 that is emitted from the light emitting unit 101 and reflected by the object OB and non-detection-target-object reflected light current according to a received amount of light (for example, reflected light L3 reflected by a housing 11) other than the reflected light L2. The measurement current generated by the light receiving unit 102 is output to the proximity sensor analog-to-digital conversion unit 103.

The proximity sensor analog-to-digital conversion unit 103 performs AD conversion (analog-to-digital conversion) of the current output from the light receiving unit 102 and outputs a value represented by a digital signal to a measurement current value acquisition unit 112 described below. The proximity sensor analog-to-digital conversion unit 103 is constituted by an integrating circuit, a comparator circuit, and the like, and is able to perform conversion into the digital signal by accumulating electric charge flowed by the current and detecting an amount of the electric charge. The digital signal converted by the proximity sensor analog-to-digital conversion unit 103 has a digital value correlated to a distance from the detection object OB and is output to the measurement current value acquisition unit 112.

An offset value is stored in the storage unit 104. The offset value is a value according to a current value of the non-detection-target-object reflected light current. In other words, the offset value is a value usable for making an output value from the proximity sensor 100 constant in a state where there is no object OB.

An initial calibration flag is also stored in the storage unit 104. The initial calibration flag is used to perform recording about whether or not the offset value is updated in the initial calibration. For example, when the offset value is updated in the initial calibration, the flag is set to "1". In a case where the initial calibration is not executed, for example, immediately after activation or resetting, the flag is set to "0". It is desirable that the flag is able to be set to "0" from outside when an abnormal state or the like occurs in the calibration and the initial calibration is forcibly performed from outside. Note that, if the numerical values of the flag assigned to the respective states are inverted, there is no problem.

The cover 105 transmits the outgoing light L1 and prevents a foreign substance from entering the proximity sensor 100. The cover 105 is constituted by resin, glass, or the like that transmits outgoing light and reflected light.

(Details of Proximity Sensor Control Unit)

The proximity sensor control unit 110 determines whether the calibration is executed (the offset value is updated) at all times when the proximity sensor is activated and when the proximity sensor is in a normal operation.

The proximity sensor control unit 110 determines a current state of the proximity sensor 100, and when determining that the calibration is not necessary, does not update the offset value. When not updating the offset value, the proximity sensor control unit 110 subtracts the offset value stored in the storage unit 104 from the digital value input from the proximity sensor analog-to-digital conversion unit 103. Then, the proximity sensor control unit 110 outputs the calculated value to outside of the proximity sensor 100 as a digital value of a proximity detection result.

When determining that the calibration is necessary, the proximity sensor control unit 110 executes one or both of initial calibration and constant calibration and updates the offset value. Then, the proximity sensor control unit 110 subtracts the offset value stored in the storage unit 104 from the digital value input from the proximity sensor analog-to-digital conversion unit 103, and outputs the calculated value to outside of the proximity sensor 100 as a digital value of a proximity detection result.

In the present embodiment, the initial calibration is calibration executed first when the proximity sensor 100 is activated and is performed to correct a large error due to noise floor or the like when the offset value is set. In the present embodiment, the constant calibration is a calibration method using averaging and is performed to correct the offset value by following change in an external environment not promptly but gradually.

The proximity sensor control unit 110 is described in detail below. In the following description, a measurement current value that is acquired by the proximity sensor analog-to-digital conversion unit 103 in determination of executing the initial calibration is referred to as an initial measurement current value and a current value acquired by the proximity sensor analog-to-digital conversion unit 103 in other cases is referred to as a measurement current value.

The proximity sensor control unit 110 integrally controls various configurations in the proximity sensor 100 and is configured to include a processor such as a CPU (central processing unit). The proximity sensor control unit 110 includes the light emission instruction unit 111, the measurement current value acquisition unit 112, an initial calibration execution unit 120, and a constant calibration execution unit 130.

The light emission instruction unit 111 supplies current to the light emitting unit 101 on the basis of an instruction from the initial calibration execution unit 120 or the constant calibration execution unit 130.

The measurement current value acquisition unit 112 acquires a current value output from the proximity sensor analog-to-digital conversion unit 103 and outputs the current value to the initial calibration execution unit 120 or the constant calibration execution unit 130 as the initial measurement current value or the measurement current value.

(Initial Calibration Execution Unit)

The initial calibration execution unit 120 (first execution unit) executes initial calibration (first calibration) in which the offset value according to the current value of the non-detection-target-object reflected light current is updated on the basis of the current value of the measurement current in a case where the current value of the measurement current is equal to or less than an initial threshold, and the offset value is not updated in a case where the current value of the measurement current is higher than the initial threshold.

The initial calibration execution unit 120 includes a flag determination unit 121 (offset value update determination unit) that determines whether or not the offset value has been updated in the initial calibration, and in a case where the flag determination unit 121 determines that the offset value has not been updated in the initial calibration, the initial calibration execution unit 120 updates the offset value in the initial calibration.

Specifically, the initial calibration execution unit 120 includes the flag determination unit 121 and an offset value calculation unit 122.

The flag determination unit 121 determines whether or not the initial calibration flag is "0" and thereby determines whether or not the offset value has been updated in the initial calibration. In other words, the flag determination unit 121 determines whether or not the offset value is a value that has been updated in the initial calibration.

The flag determination unit 121 reads an initial calibration flag stored in the storage unit 104 in a case where (1) the proximity sensor 100 is activated, (2) a signal indicating that a correction measurement value is equal to or less than a lower limit threshold is received from a lower limit threshold determination unit 133, or (3) a signal indicating that change in external environment light is detected is received from an external light determination unit 134. The flag determination unit 121 determines that the offset value has not been updated in the initial calibration when the flag is "0" and determines that the offset value has been updated in the initial calibration when the flag is "1". Note that, the initial calibration flag is "0" immediately after the proximity sensor 100 is activated.

The flag determination unit 121 transmits a determination result indicating whether or not the offset value has been updated in the initial calibration to the offset value calculation unit 122.

When receiving a determination result indicating that the offset value has not been updated in the initial calibration (the initial calibration flag is "0") from the flag determination unit 121, the offset value calculation unit 122 instructs the light emission instruction unit 111 to supply current to the light emitting unit 101.

The offset value calculation unit 122 determines whether or not the initial measurement current value output from the proximity sensor analog-to-digital conversion unit 103 is equal to or less than an initial threshold. When determining that the initial measurement current value is equal to or less than the initial threshold, the offset value calculation unit 122 calculates a new offset value on the basis of the initial measurement current value.

The initial threshold may be set as a value that includes a current value considered to be generated from the reflected light L3 (refer to FIG. 2) due to internal reflection or the like and a proximity detection threshold usable for determining proximity. Specifically, for example, when the current value of the non-detection-target-object reflected light current that is output from the proximity sensor analog-to-digital conversion unit 103 due to the reflected light L3 is about 1000 and the proximity detection threshold usable for determining proximity in the current value of the object reflected light current is 500, the initial value may be set to 1500.

Here, for example, in a case where variation of the current value of the non-detection-target-object reflected light current due to the reflected light L3 of the housing 11 is large between mobile phones, when the initial value is small, there is a possibility that the offset value may not be able to be updated in the initial calibration, which is a problem, but it is possible to avoid the problem by setting a larger initial value. Thus, it is desirable that the initial value is able to be set from outside.

Though a new offset value in the initial calibration is able to be calculated, for example, as "new offset value=initial measurement current value", it is desirable that the calculation of the offset value is defined so that a value obtained by "initial measurement current value−offset value" is not a lower limit value (for example, 0) of a proximity detection result. This is because whether or not the initial calibration executed is erroneous calibration is able to be determined. A reason therefor is described below.

As the proximity detection result, "measurement current value−offset value" (correction measurement value) is output from the proximity sensor 100. In a case where only the initial calibration is performed as the calibration, when "new offset value=initial measurement current value" is set in the initial calibration, an initial correction measurement value (initial measurement current value−offset value) of "0" is first output to outside as the proximity detection result.

Here, in a case where the initial measurement current value is acquired in a state where there is the object OB, when the object OB disappears after that, a subsequent proximity detection result is supposed to be reduced. However, in a case where the lower limit value of the proximity detection result is 0, even when the object OB disappears, the proximity detection result does not become smaller than 0. As a result, the proximity detection result is output while being kept at "0" which is larger than an actual value, and a distance from the proximity sensor 100 to the object OB, which is calculated on the basis of the proximity detection result, is shorter than an actual distance, and thus determination of proximity is not able to be made correctly.

In order to avoid such a problem, the offset value after the initial calibration is set so that a value (initial correction measurement value) obtained by subtracting the offset value from the initial measurement current value is higher than the lower limit value (here, higher than 0). With this, it is possible to determine whether or not the initial calibration that has been executed is erroneous calibration, after the initial calibration.

For example, the initial correction measurement value after the initial calibration is set to be 100. In a case where the initial calibration is executed in a state where there is no object OB, when the object OB is made close to the proximity sensor 100 after that, the correction measurement value increases, and when the object OB is made away from the proximity sensor 100, the correction measurement value decreases, but the correction measurement value does not become equal to or less than 100.

However, when the initial calibration is executed in a state where the object OB exists at a position where the initial measurement current value is equal to or less than the initial threshold, the initial correction measurement value is 100, but when the object OB is removed after that, the correction measurement value is equal to or less than 100. Thus, by determining whether or not the initial correction measurement value is equal to or less than 100, it is possible to determine whether or not the initial calibration executed is erroneous calibration. Due to the foregoing reason, it is desirable that a new offset value that is updated in the initial calibration is set so that the initial correction measurement value is not the lower limit value.

In the present embodiment, the aforementioned determination for judging whether or not the initial calibration is erroneous calibration is performed by the lower limit threshold determination unit 133 in constant calibration described below.

After calculating a new offset value, the offset value calculation unit 122 updates the offset value stored in the storage unit 104. After updating the offset value stored in the storage unit 104, the offset value calculation unit 122 sets the initial calibration flag of the storage unit 104 to "1" and transmits a signal instructing start of the constant calibration to a correction measurement value calculation unit 131 of the constant calibration execution unit 130.

When a determination result indicating that the offset value has been updated (the initial calibration flag is not "0") is input from the flag determination unit 121, the offset value calculation unit 122 does not update the offset value and transmits a signal instructing start of the constant calibration to the correction measurement value calculation unit 131 of the constant calibration execution unit 130.

When determining that the initial measurement current value is higher than the initial threshold, the offset value calculation unit 122 ends the initial calibration processing without updating the offset value, and transmits a signal instructing start of the constant calibration to the correction measurement value calculation unit 131 of the constant calibration execution unit 130. At this time, since the offset value has not been updated, writing of the initial calibration flag is not performed and "0" is kept.

For example, the initial measurement current value that is acquired in a case where the object OB is near the proximity sensor 100 when the mobile phone is activated or a case where a voice call is incoming during an operation of a touch panel of the mobile phone is not suitable for calculation of the offset value. Thus, the offset value is updated when the initial measurement current value output from the proximity sensor analog-to-digital conversion unit 103 is equal to or less than the initial threshold, and the offset value is not updated when the initial measurement current value is higher than the initial value, and thus an appropriate offset value is able to be used for calculation of proximity at all times. In other words, the initial calibration execution unit 120 is able to execute appropriately the calibration in consideration of the noise floor, and proximity is able to be correctly detected.

(Constant Calibration Execution Unit)

The constant calibration execution unit 130 (second execution unit) executes constant calibration (second calibration) in which a first offset value that is an offset value after the initial calibration is executed is updated to a value obtained by averaging the first offset value and the current value of the measurement current generated from the light receiving unit 102 after the initial calibration is executed.

In the constant calibration, the constant calibration execution unit 130 updates the first offset value in a case where a correction measurement value obtained by subtracting the first offset value from the current value of the measurement current generated from the light receiving unit 102 after the initial calibration is executed is equal to or less than a constant threshold.

The initial calibration and the constant calibration are alternately executed, and the constant calibration execution unit 130 does not update the first offset value in a case where the correction measurement value is equal to or less than a lower limit threshold in the constant calibration, and processing shifts to the initial calibration.

In the constant calibration, the constant calibration execution unit 130 does not update the first offset value in a case where the correction measurement value is higher than the lower limit threshold and is equal to or less than the constant threshold and change of external light is detected, and first calibration is executed.

The constant calibration execution unit 130 includes the correction measurement value calculation unit 131, a constant threshold determination unit 132, the lower limit threshold determination unit 133, the external light determination unit 134, and an average offset value calculation unit 135.

When receiving the signal instructing start of the constant calibration from the initial calibration execution unit 120, the correction measurement value calculation unit 131 instructs the light emission instruction unit 111 to supply current to the light emitting unit 101. The correction measurement value calculation unit 131 calculates a correction measurement value from the measurement current value acquired from the proximity sensor analog-to-digital conversion unit 103 and the offset value stored in the storage unit 104. Specifically, the correction measurement value is calculated by subtracting, from the measurement current value output from the proximity sensor analog-to-digital conversion unit 103, the offset value stored in the storage unit 104 at that time. When the correction measurement value is calculated, the correction measurement value calculation unit 131 outputs the correction measurement value to the constant threshold determination unit 132.

When the correction measurement value is input from the correction measurement value calculation unit 131, the constant threshold determination unit 132 determines whether or not the correction measurement value is equal to or less than a constant threshold. The constant threshold may be set as, for example, a proximity detection threshold usable for determining proximity. Moreover, the constant threshold is higher than a lower limit threshold described below.

In a case where the correction measurement value is higher than the constant threshold, it is considered that the object OB is in proximity. Thus, the constant threshold determination unit 132 does not perform the constant calibration processing and ends the constant calibration processing. In a case where the correction measurement value is equal to or less than the constant threshold, the constant threshold determination unit 132 transmits a signal indicating that the correction measurement value is equal to or less than the constant threshold to the lower limit threshold determination unit 133.

In a case where a calculated value (correction measurement value) obtained by subtracting the offset value stored in the storage unit 104 from the measurement current value after the initial calibration is executed is equal to or less than the lower limit threshold, the lower limit threshold determination unit 133 does not update the offset value in the constant calibration, and the initial calibration is executed. In other words, when receiving a signal indicating that the correction measurement value is equal to or less than the constant threshold from the constant threshold determination unit 132, the lower limit threshold determination unit 133 determines whether the initial calibration has abnormality, and in a case where the initial calibration has abnormality, the lower limit threshold determination unit 133 does not update the offset value in the constant calibration, and the initial calibration is again executed.

In a case where the initial calibration has abnormality, that is, in a case where the offset value calculated in the initial calibration and stored in the storage unit 104 has abnormality, there is a possibility that the proximity sensor 100 outputs an erroneous correction measurement value to outside, which may result in occurrence of an erroneous operation of the mobile phone or the like. Thus, in a case where it is determined that the initial calibration has abnormality obviously, the initial calibration needs to be executed again by deleting the offset value stored in the storage unit 104.

The lower limit threshold determination unit 133 determines that the initial calibration has abnormality when the correction measurement value is equal to or less than the lower limit threshold. At this time, the lower limit threshold determination unit 133 sets the initial calibration flag to 0 that indicates a state where the initial calibration has not been performed, and then ends the constant calibration. Accordingly, the initial calibration is executed again without updating the offset value in the constant calibration.

Here, the lower limit threshold is desired to be equal to or less than a value (initial correction measurement value) obtained by subtracting the offset value from the initial measurement current value in the initial calibration. It is assumed that, in a state where the initial correction measurement value after the initial calibration is set to be 100, a value (correction measurement value) obtained by subtracting, from the measurement current value generated from the light receiving unit 102 after the initial calibration, the offset value stored in the storage unit 104 at that time is 0, for example. This corresponds to a case where the initial calibration is erroneously executed in a state where there is the object OB and the object OB is then made farther or removed. Thus, by setting the lower limit threshold to be equal to or less than the initial correction measurement value, it is possible to determine that the initial calibration has been executed in an abnormal state when the correction measurement value is equal to or less than the lower limit threshold.

In a case where the correction measurement value is equal to or less than the lower limit threshold, the lower limit threshold determination unit 133 sets the initial calibration flag to "0" that indicates a state where the offset value has not been updated in the initial calibration, and then ends the constant calibration. Accordingly, the initial calibration is executed again without updating the offset value in the constant calibration. The lower limit threshold determination unit 133 transmits a signal indicating that the correction measurement value is equal to or less than the lower limit threshold to the flag determination unit 121.

When the correction measurement value is higher than the lower limit threshold, the lower limit threshold determination unit 133 transmits a signal indicating that the correction measurement value is higher than the lower limit threshold to the external light determination unit 134.

When receiving the signal indicating that the correction measurement value is higher than the lower limit threshold from the lower limit threshold determination unit 133, the external light determination unit 134 determines whether or not change in external light (external environment light) is detected after the initial calibration is executed. When the external light determination unit 134 detects change in the external environment light, the initial calibration is executed without updating the offset value in the constant calibration.

In the proximity sensor 100 using the light emitting unit 101 that emits infrared rays, characteristics of light received by the light receiving unit 102 may greatly change between under an environment of a light source, such as sunlight, incandescent light, or halogen light, which contains a large amount of infrared rays and under an environment of a light source, such as white fluorescent light or white LED, which contains almost no infrared rays.

Specifically, in a case where a user moves from outdoors to indoors or from indoors to outdoors and (1) activates the proximity sensor 100 under the environment of the light source which contains a large amount of infrared rays and moves to the environment of the light source which does not contain infrared rays, or, to the contrary, (2) activates the proximity sensor 100 under the environment of the light source which does not contain infrared rays and moves to the environment of the light source which contains infrared rays, there is a possibility that characteristics of the external environment light suddenly change and the proximity sensor 100 outputs an erroneous proximity detection result.

For example, in a case where the user is calling without putting the mobile phone on his or her ear as in a hands-free mode, it is determined that the mobile phone is in no proximity even during calling. In a case where the user moves, for example, from indoors to outdoors or from outdoors to indoors to the contrary in such a state, there is a possibility that characteristics of the proximity sensor 100 change due to change in an ambient temperature environment or change in the light source. When the user returns the mode to a normal calling mode in such a state and carries out an action to make the object OB close, for example, by putting the mobile phone on his or her ear, there is a possibility that the object OB is not able to be normally detected even when the object OB is made close.

Thus, a state of the external environment light is detected and held, and when the state changes, the external light determination unit 134 sets the initial calibration flag to "0"

that indicates a state where the offset value is not updated in the initial calibration, and then ends the constant calibration. Accordingly, the initial calibration is executed again without updating the offset value in the constant calibration.

Examples of a method of detecting change in the state of the external environment light include the following method. That is, in a state where the light emitting unit 101 is not driven and no infrared rays are emitted from the light emitting unit 101, current generated in the light receiving unit 102 is detected, and thus infrared rays incident from outside are able to be detected. This makes it possible to detect the state of the external environment light. The external light determination unit 134 compares the state of the external environment light during activation and the state of the external environment light during the constant calibration, which are acquired by the aforementioned method, and when there is a change of a predetermined value or more, the external light determination unit 134 may determine that change in the external environment light is detected.

In a proximity illumination intensity sensor 400 (refer to Embodiment 2) that has both a proximity sensor function and an illumination intensity sensor function of detecting illumination intensity of ambient environment light, it is possible to detect illumination intensity of external visible light and illumination intensity of external infrared rays by the illumination intensity sensor function. The external light determination unit 134 compares a ratio of visible light and infrared rays of the external environment light during activation and a ratio of visible light and infrared rays during the constant calibration, and when there is change of a predetermined value or more, the external light determination unit 134 may determine that change in the external environment light is detected.

When detecting no change in the external environment light, the external light determination unit 134 transmits a signal indicating that change in the external environment light is not detected to the average offset value calculation unit 135.

When detecting change in the external environment light, the external light determination unit 134 transmits a signal indicating that change in the external environment light is detected to the flag determination unit 121.

(Average Offset Value Calculation Unit 135)

The average offset value calculation unit 135 updates the offset value stored in the storage unit 104 (offset value stored in the storage unit 104 after the initial calibration: first offset value) to a value obtained by averaging the current value (current value of the measurement current generated from the light receiving unit 102 after the initial calibration) and the offset value (first offset value).

Specifically, when receiving the signal indicating that change in the external environment light is not detected from the external light determination unit 134, the average offset value calculation unit 135 updates the offset value stored in the storage unit 104 with the offset value calculated by the averaging.

That is, in a case where the offset value is able to be updated in the constant calibration, the average offset value calculation unit 135 updates the offset value in the constant calibration through the averaging. The averaging is executed, for example, by the following expression.

$$y(n) = \alpha \cdot y(n-1) + (1-\alpha) \cdot x(n) \qquad \text{Expression (1)}$$
$$= y(n-1) + (1-\alpha) \cdot \{x(n) - y(n-1)\}$$

In the expression (1), y(n) is a result of the constant calibration, which is newly obtained by calculation, y(n−1) is a calibration result (offset value stored in the storage unit 104 after the initial calibration) before the calculation, and x(n) is a digital signal (measurement current value acquired by the correction measurement value calculation unit 131) that is output from the proximity sensor analog-to-digital conversion unit 103 after the initial calibration. A difference between x(n) and y(n−1) is output to outside as a proximity detection result from the proximity sensor 100. That is, a value obtained by subtracting the offset value before update through the averaging from the measurement current value acquired by the correction measurement value calculation unit 131 is output to outside as the proximity detection result. Moreover, a is a coefficient of averaging, and a change amount when the offset value is updated in the constant calibration is able to be reduced when a value of a is increased and the change amount when the offset value is updated in the constant calibration is able to be increased when the value of a is reduced to the contrary.

The average offset value calculation unit 135 updates the offset value stored in the storage unit 104 by using y(n), which is a result of the constant calibration and calculated by the average offset value calculation unit 135, as a new offset value in the constant calibration.

After updating the offset value, the average offset value calculation unit 135 ends the constant calibration processing and transmits a signal indicating that the constant calibration ends to the flag determination unit 121.

(Initial Calibration Processing)

Figure 3:
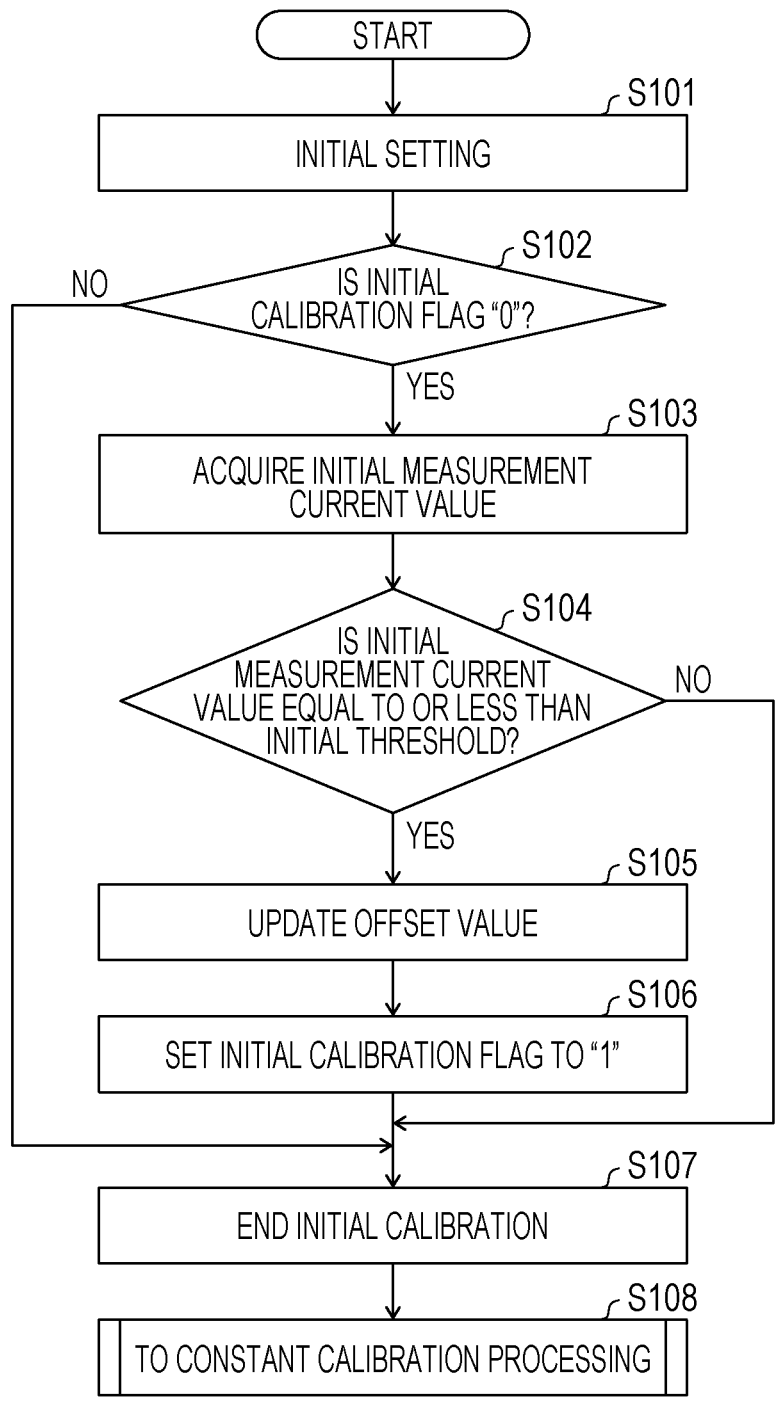
FIG. 3 is a flowchart illustrating an example of a flow of initial calibration processing of the proximity sensor.

FIG. 3 is a flowchart illustrating an example of a flow of initial calibration processing of the proximity sensor 100. As illustrated in FIG. 3, first, power of the proximity sensor 100 is turned on or the proximity sensor 100 is activated by an activation signal, an activation instruction command, or the like. This corresponds to a case where power of the mobile phone is turned on or a voice call is incoming.

Next, initial setting of the proximity sensor 100 is performed (S01). The initial setting may be performed from a control unit or the like of the mobile phone in a case where the proximity sensor 100 has a setting resistor or the like and allows setting change from outside. In a case where the initial setting of the proximity sensor 100 is not able to be performed or not necessary, the processing of S101 is not necessary.

Next, whether to execute the initial calibration is determined through S102 to S104. First, the flag determination unit 121 determines whether or not the initial calibration flag is "0" (S102: offset value update determination step). When the initial calibration flag is "0" (YES at S102), the offset value calculation unit 122 supplies current to the light emitting unit 101 to thereby cause the light emitting unit 101 to emit light, acquires an initial measurement current value generated in the light receiving unit 102 (S103: light emitting step and light receiving step), and determines whether or not the initial measurement current value is equal to or less than the initial threshold (S104). In a case where the initial measurement current value is equal to or less than the initial threshold (YES at S104), the offset value calculation unit 122 updates the offset value (S105: first execution step). Specifically, the offset value calculation unit 122 calculates a new offset value and updates the offset value stored in the storage unit 104. Then, the offset value calculation unit 122 sets the initial calibration flag of the storage unit 104 to "1" (S106), ends the initial calibration (S107), and the process shifts to the constant calibration processing (S108).

In a case where the initial calibration flag is "1" at S102 (NO at S102), the offset value calculation unit 122 ends the initial calibration (S107) and the process shifts to the constant calibration processing (S108).

In a case where the initial measurement current value is higher than the initial threshold at S104 (NO at S104), the offset value calculation unit 122 ends the initial calibration (S107) and the process shifts to the constant calibration processing (S108).

(Constant Calibration Processing)

Figure 4:
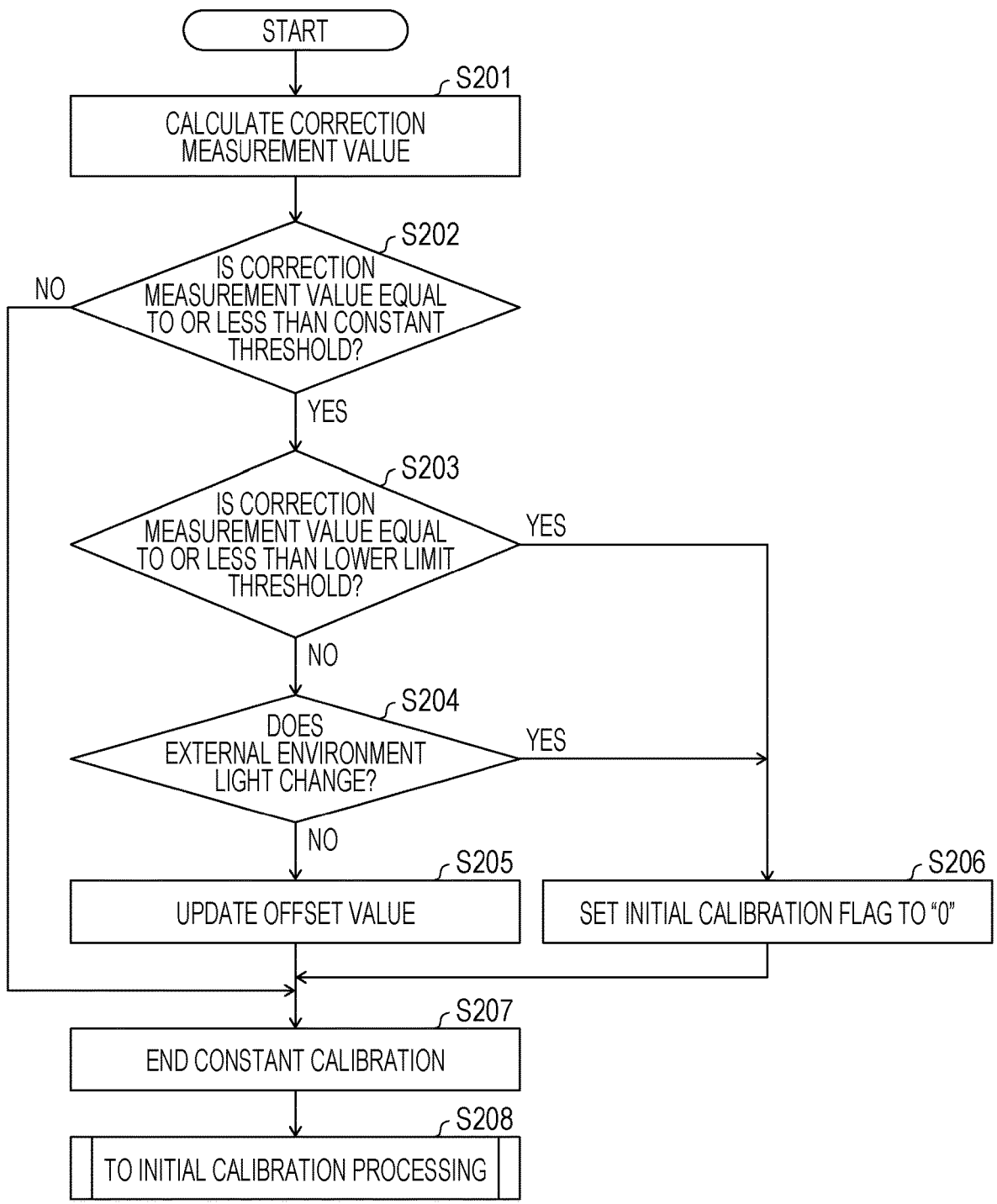
FIG. 4 is a flowchart illustrating an example of a flow of constant calibration processing of the proximity sensor.

FIG. 4 is a flowchart illustrating an example of a flow of constant calibration processing of the proximity sensor 100. Note that, the initial calibration processing of FIG. 3 and the constant calibration processing of FIG. 4 are performed continuously.

As illustrated in FIG. 4, first, the correction measurement value calculation unit 131 supplies current to the light emitting unit 101 to thereby acquire a measurement current value, and calculates a correction measurement value by the measurement current value and the offset value stored in the storage unit 104 (S201). Next, the constant threshold determination unit 132 determines whether or not the correction measurement value is equal to or less than the constant threshold (S202). In a case where the correction measurement value is equal to or less than the constant threshold (YES at S202), the lower limit threshold determination unit 133 determines whether or not the correction measurement value is equal to or less than the lower limit threshold (S203).

In a case where the correction measurement value is higher than the lower limit threshold (NO at S203), the external light determination unit 134 determines whether or not external environment light changes (S204). In a case where the external environment light does not change (NO at S204), the average offset value calculation unit 135 updates the offset value (S205: second execution step). Specifically, the average offset value calculation unit 135 updates the offset value stored in the storage unit 104 with an offset value calculated by averaging. Then, the average offset value calculation unit 135 ends the constant calibration (S207) and the process shifts to the initial calibration processing (S208).

In a case where the correction measurement value is higher than the constant threshold at S202 (NO at S202), the constant threshold determination unit 132 ends the constant calibration (S207) and the process shifts to the initial calibration processing (S208).

In a case where the correction measurement value is equal to or less than the lower limit threshold at S203 (YES at S203), the lower limit threshold determination unit 133 sets the initial calibration flag of the storage unit 104 to "0" (S206), ends the constant calibration (S207), and the process shifts to the initial calibration processing (S208).

In a case where the external environment light changes at S204 (YES at S204), the external light determination unit 134 sets the initial calibration flag of the storage unit 104 to "0" (S206), ends the constant calibration (S207), and the process shifts to the initial calibration processing (S208).

Note that, the order of determination from S202 to S204 indicated here is an example and the determination does not need to be performed in the order as in the present embodiment, and a result of calibration is not affected even when the order is changed.

Embodiment 2

Figure 5:
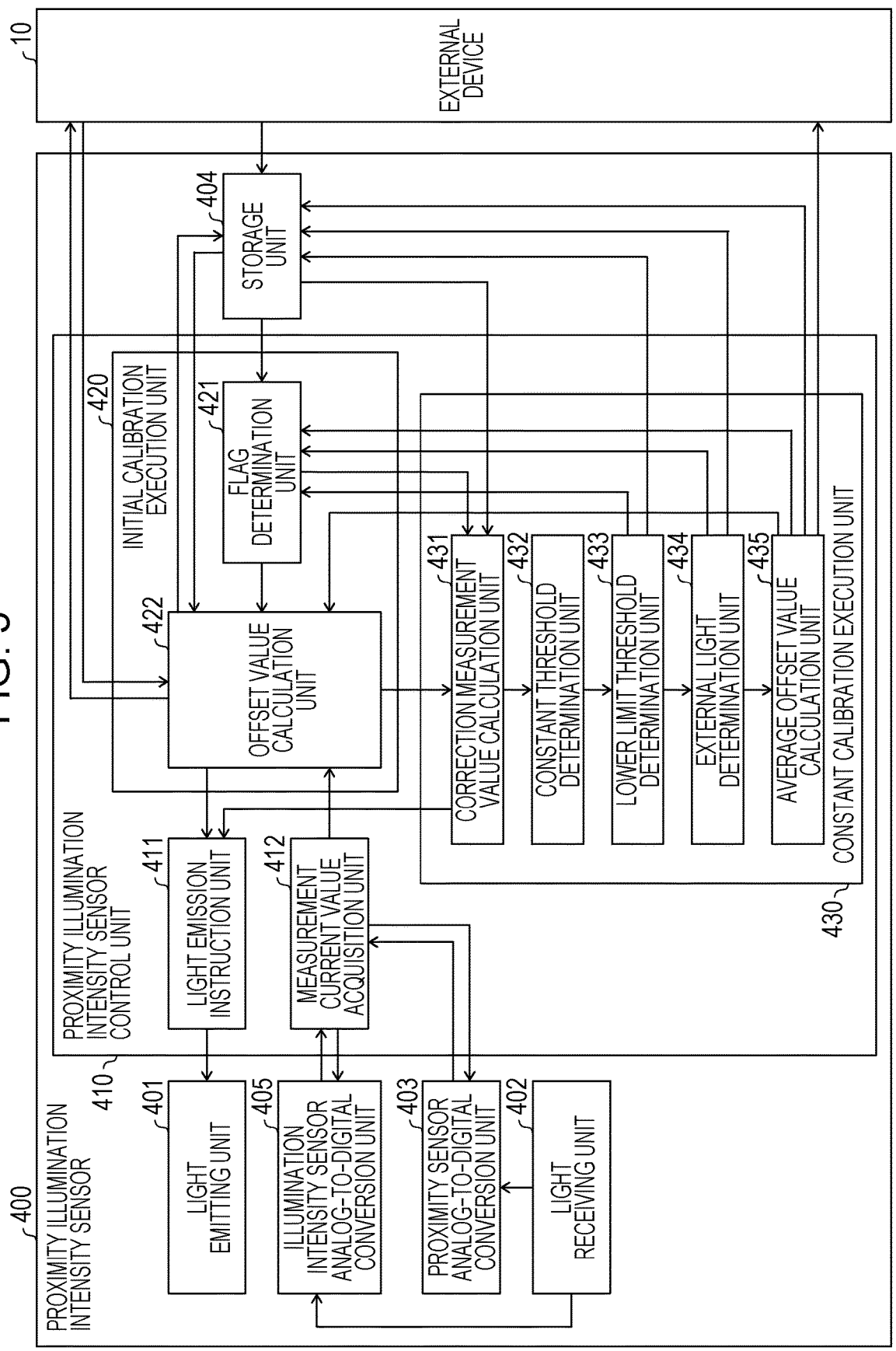
FIG. 5 is a functional block diagram illustrating a schematic configuration of a proximity illumination intensity sensor according to Embodiment 2 of the invention.

The proximity illumination intensity sensor 400 of the embodiment of the invention is described as follows with reference to FIG. 5. Note that, for convenience of description, a member having the same function as that of the member described in Embodiment 1 is given the same reference sign and description thereof is omitted. FIG. 5 is a functional block diagram illustrating a schematic configuration of the proximity illumination intensity sensor 400 according to Embodiment 2 of the invention. The proximity illumination intensity sensor 400 includes the illumination intensity sensor function of detecting illumination intensity of external environment light in the proximity sensor 100.

The proximity illumination intensity sensor 400 illustrated in FIG. 5 has both the proximity sensor function of detecting whether or not a detection object is in proximity and the illumination intensity sensor function of measuring illumination intensity of external environment light, and is constituted by a light emitting unit 401, a light receiving unit 402, a proximity sensor analog-to-digital conversion unit 403, a storage unit 404, an illumination intensity sensor analog-to-digital conversion unit 405, and a proximity illumination intensity sensor control unit 410.

The light emitting unit 401, the light receiving unit 402, the proximity sensor analog-to-digital conversion unit 403, and the storage unit 404 have almost the same functions as those of the light emitting unit 101, the light receiving unit 102, the proximity sensor analog-to-digital conversion unit 103, and the storage unit 104 that are illustrated in FIG. 1.

Components (a light emission instruction unit 411, a measurement current value acquisition unit 412, an initial calibration execution unit 420, a flag determination unit 421, an offset value calculation unit 422, a constant calibration execution unit 430, a correction measurement value calculation unit 431, a constant threshold determination unit 432, a lower limit threshold determination unit 433, an external light determination unit 434, and an average offset value calculation unit 435) of the proximity illumination intensity sensor control unit 410 have similar functions to those of the components (the light emission instruction unit 111, the measurement current value acquisition unit 112, the initial calibration execution unit 120, the flag determination unit 121, the offset value calculation unit 122, the constant calibration execution unit 130, the correction measurement value calculation unit 131, the constant threshold determination unit 132, the lower limit threshold determination unit 133, the external light determination unit 134, and the average offset value calculation unit 135) of the proximity sensor control unit 110.

That is, the proximity illumination intensity sensor 400 illustrated in FIG. 5 is different from the proximity sensor 100 illustrated in FIG. 1 in that the illumination intensity sensor analog-to-digital conversion unit 405 is further provided, and is similar to the proximity sensor 100 in the other components.

When the light receiving unit 402 receives external light (external environment light) and the illumination intensity sensor analog-to-digital conversion unit 405 generates current according to an amount of the received light, the proximity illumination intensity sensor 400 is able to detect illumination intensity of the external environment light. An outline of an operation of the proximity illumination intensity sensor control unit 410 is described below.

During an operation of the proximity sensor, the proximity illumination intensity sensor control unit 410 emits infrared rays by the light emitting unit 401 and receives the infrared rays reflected by the object OB by the light receiving unit 402. The current generated in the light receiving unit 402 is input to the proximity sensor analog-to-digital conversion unit 403. The proximity sensor analog-to-digital conversion unit 403 is constituted by an integrating circuit, a comparator circuit, or the like, and is able to perform conversion into a digital signal by accumulating electric charge flowed by the current and detecting an amount of the electric charge. The digital signal is output to outside from the proximity illumination intensity sensor 400 through the proximity illumination intensity sensor control unit 410.

At this time, the digital signal that is output is processed by the initial calibration execution unit 420 and the constant calibration execution unit 430, corrected by using an offset value stored in the storage unit 404, and output by the proximity illumination intensity sensor 400.

Here, an operation and a method of calibration (initial calibration and constant calibration) are the same as those in FIGS. 3 and 4, and thus description thereof is omitted. Note that, during the operation of the proximity sensor in the proximity illumination intensity sensor 400, the illumination intensity sensor analog-to-digital conversion unit 405 is turned off by the proximity illumination intensity sensor control unit 410.

On the other hand, during an operation of the illumination intensity sensor, the proximity illumination intensity sensor control unit 410 turns off the light emitting unit 401 and the proximity sensor analog-to-digital conversion unit 403 and operates the illumination intensity sensor analog-to-digital conversion unit 405.

The light receiving unit 402 receives the external environment light and generates current according to an amount of the received light. The current is input to the illumination intensity sensor analog-to-digital conversion unit 405 and converted into a digital signal in a similar manner as in the proximity sensor analog-to-digital conversion unit 403. The digital signal is output to outside from the proximity illumination intensity sensor 400 through the proximity illumination intensity sensor control unit 410.

At this time, the digital signal that is output is processed by the initial calibration execution unit 420 and the constant calibration execution unit 430, corrected by using the offset value stored in the storage unit 404, and output by the proximity illumination intensity sensor 400.

When the calibration of the invention is performed by using the proximity illumination intensity sensor 400, it is easy to detect change in the external environment light at S204 of FIG. 4, and accuracy of the calibration of the proximity illumination intensity sensor 400 is able to be improved.

Embodiment 3

Embodiment 3 of the invention is described as follows with reference to FIGS. 6 and 7. Note that, for convenience of description, a member having the same function as the member described in the foregoing embodiments is given the same reference sign and description thereof is omitted.
(Application of Proximity Sensor)

An exemplary application of the proximity sensor 100 is described. First, as an example, a case where a mobile phone or a media player is used as an electronic device is described.

When there is an incoming call to the mobile phone, a user performs an action to put the mobile phone on his or her ear. At this time, in a case where display of a screen with a touch panel is on and a touch panel function is in an active state, when the user puts the mobile phone on his or her ear and human skin contacts with the screen, the mobile phone may be erroneously operated. In order to prevent such an erroneous operation, the proximity sensor 100 is used.

Specifically, in a case where there is an incoming call while the display of the screen is on and the touch panel function is in the active state, when the user puts the mobile phone on his or her ear and the proximity sensor 100 detects human skin in proximity, a control unit included in the mobile phone performs the following control in accordance with a detection result of the proximity sensor 100.

That is, in a case where there is an incoming call while the display of the screen is on and the touch panel function is in the active state, and the proximity sensor 100 detects human skin in proximity, the control unit turns off the display of the screen and switches the state of the touch panel function from the active state to a non-active state. When a voice call ends and the mobile phone is away from the human skin and the proximity sensor 100 detects that a state of the mobile phone in proximity to the human skin is shifted to a state thereof in no proximity, the control unit turns on the display of the screen again and switches the state of the touch panel function to the active state again.

Next, an example when the proximity sensor 100 is used for a media player that is a mobile device is described.

First, a media player in which the proximity sensor 100 is not mounted is described. In the media player in which the proximity sensor 100 is not mounted, a user normally presses a button to turn off power of a screen with a touch panel that is included in the media player. The power of the screen is turned off, for example, when the media player is put in a pocket.

On the other hand, a control unit included in a media player in which the proximity sensor 100 is mounted performs the following control in accordance with a detection result of the proximity sensor 100.

That is, in a case where the media player in which the proximity sensor 100 is mounted is put in a pocket while display of a screen is on and a touch panel function is in an active state, the proximity sensor 100 detects that the media player is in proximity to fabric of clothing (or fabric of the pocket). In such a case, the control unit turns off the display of the screen and switches the state of the touch panel function to a non-active state.

Moreover, when the media player is taken out from the pocket and the proximity sensor 100 detects that the media player is in no proximity to the fabric of the clothing (or fabric of the pocket), the control unit turns on the display of the screen again and switches the state of the touch panel function to the active state again.

By performing the control as described above, it is possible to prevent a mobile device, such as a medial player, from being erroneously operated because the touch panel function is in the active state in a time period that is not intended by the user. Further, by turning off the display of the screen, it is possible to achieve reduction in power consumption.

Next, a specific example of an electronic device including the proximity sensor 100 is described with reference to FIGS. 6 and 7. FIGS. 6 and 7 each illustrate an example of the electronic device according to the present embodiment. FIG. 6 is a perspective view illustrating an example of the electronic device according to the present embodiment. The electronic device illustrated in FIG. 6 is a mobile phone 500. FIG. 7 is a back view illustrating another example of the electronic device according to the present embodiment. The electronic device illustrated in FIG. 7 is a digital camera 600.

Figure 6:
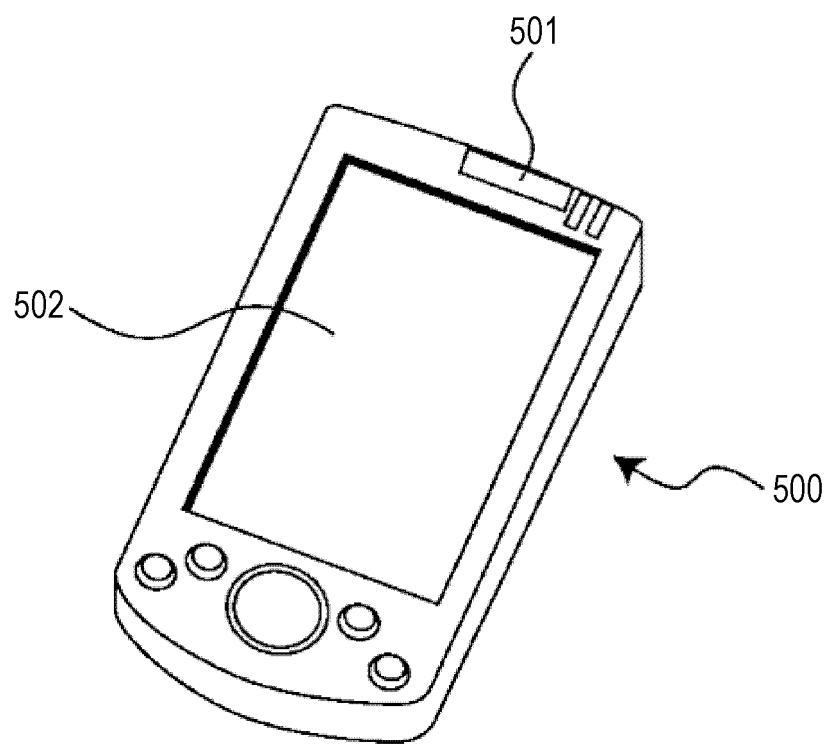
FIG. 6 is a perspective view illustrating an example of an electronic device according to Embodiment 3 of the invention.

As illustrated in FIG. 6, in the mobile phone 500, any one of the proximity sensor 100 and the proximity illumination intensity sensor 400 that are described above is provided as a proximity sensor 501 at a top of a display unit 502. The mobile phone 500 performs switching between on and off of display of the display unit 502 and switching between on and off of a touch panel operation in accordance with a proximity state or a non-proximity state of the object OB (refer to FIG. 2).

By providing the proximity sensor 100 or the proximity illumination intensity sensor 400 as the proximity sensor 501, accuracy of calibration is able to be improved compared to a sensor of the related art, and as a result, an erroneous operation of the mobile phone 500 is able to be reduced. In particular, also in a case where characteristics of the proximity sensor 501 change due to change in external temperature, external environment light, or the like in a state where the proximity sensor 501 is continuously operated in a non-proximity state, such as in a hands-free mode, during a voice call, an output value of the proximity sensor 501 is able to be stabilized by continuing calibration. As a result, an erroneous operation of the mobile phone 500 is able to be reduced.

Figure 7:
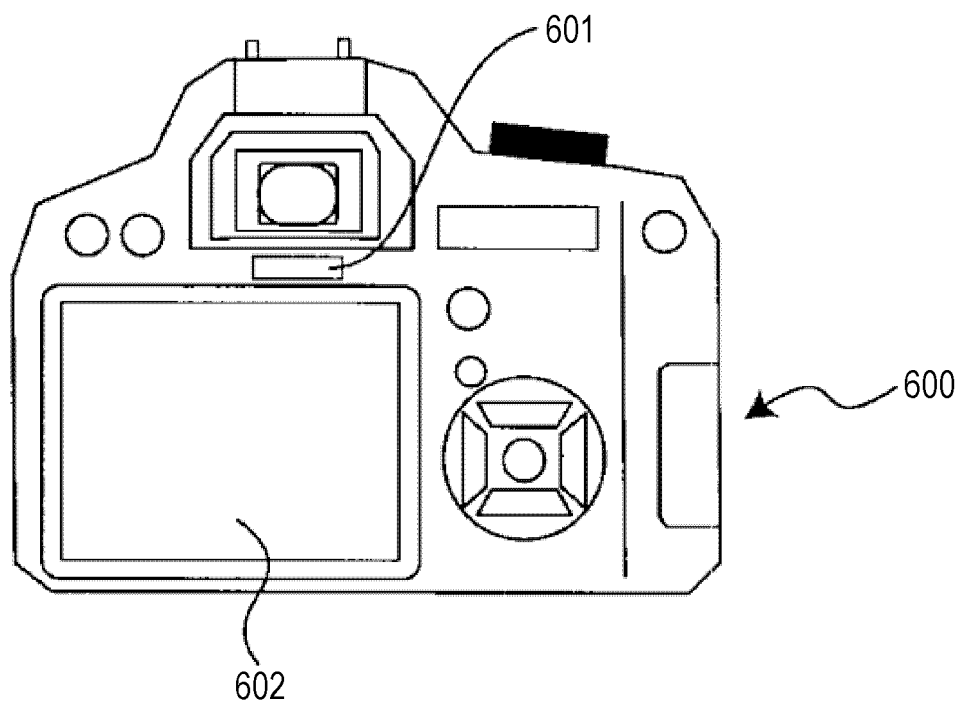
FIG. 7 is a back view illustrating another example of the electronic device.
Figure 8:
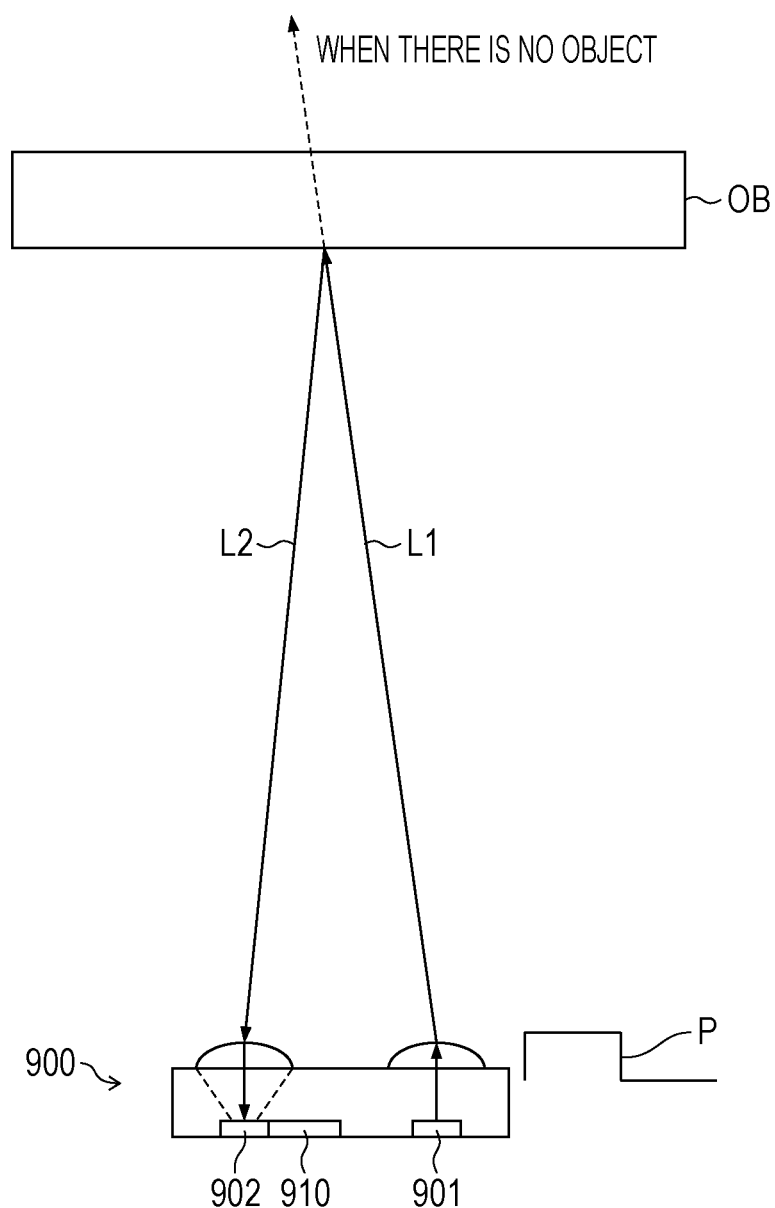
FIG. 8 is a view for explaining an operation principle of a proximity sensor of the related art.
Figure 9:
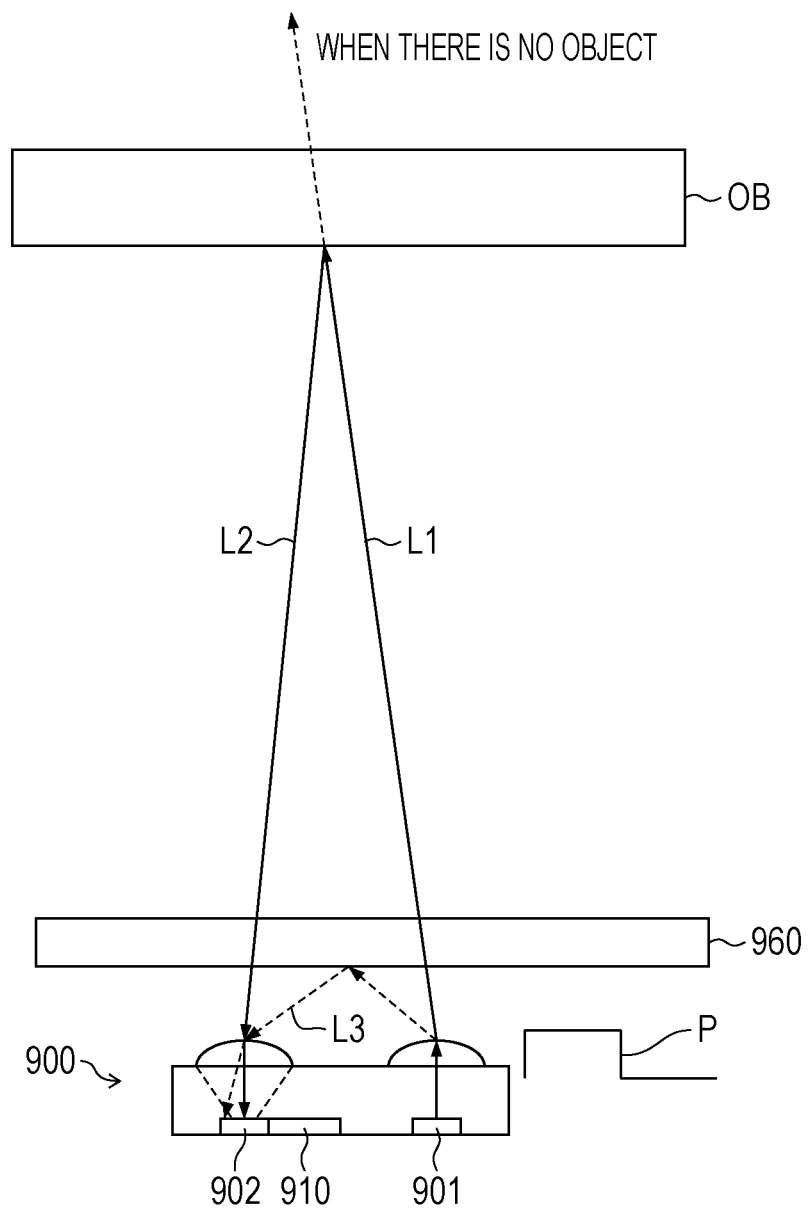
FIG. 9 is a view for explaining a problem of the proximity sensor of the related art.
Figure 10:
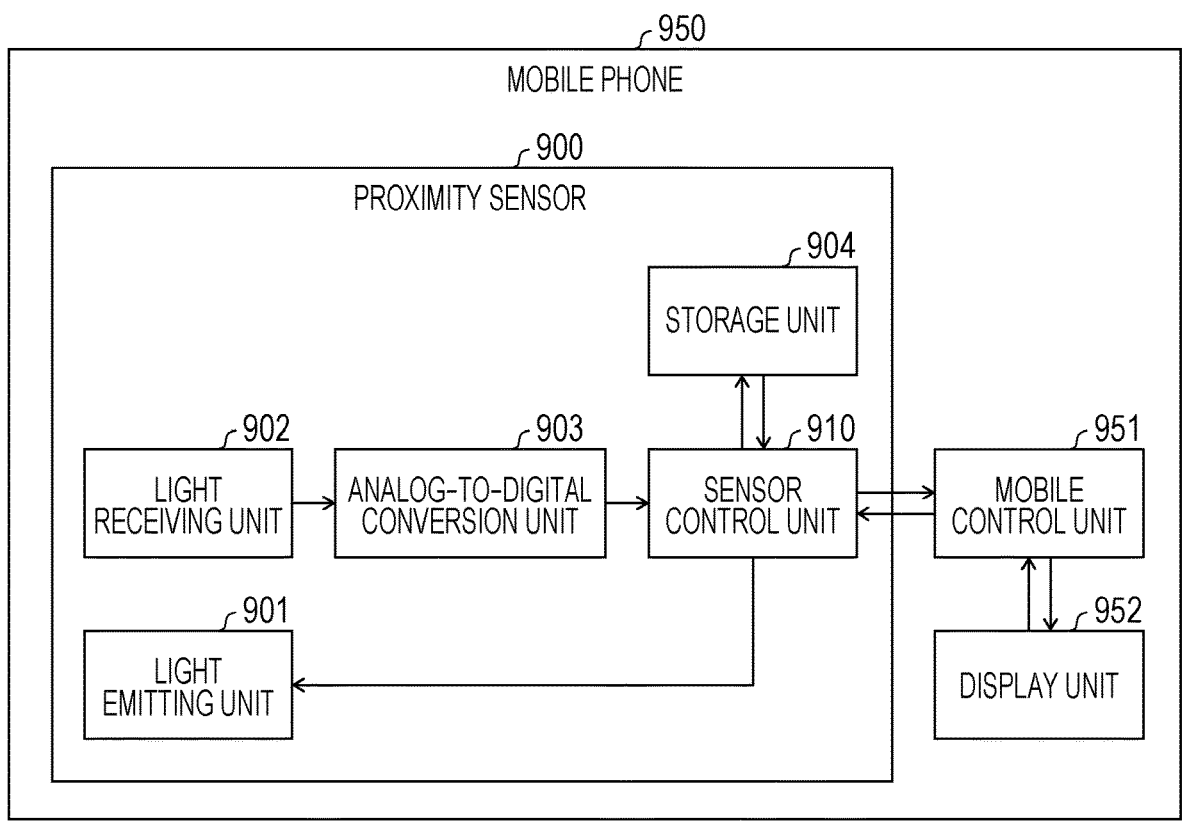
FIG. 10 is a functional block diagram illustrating a schematic configuration of the proximity sensor of the related art.
Figure 11:
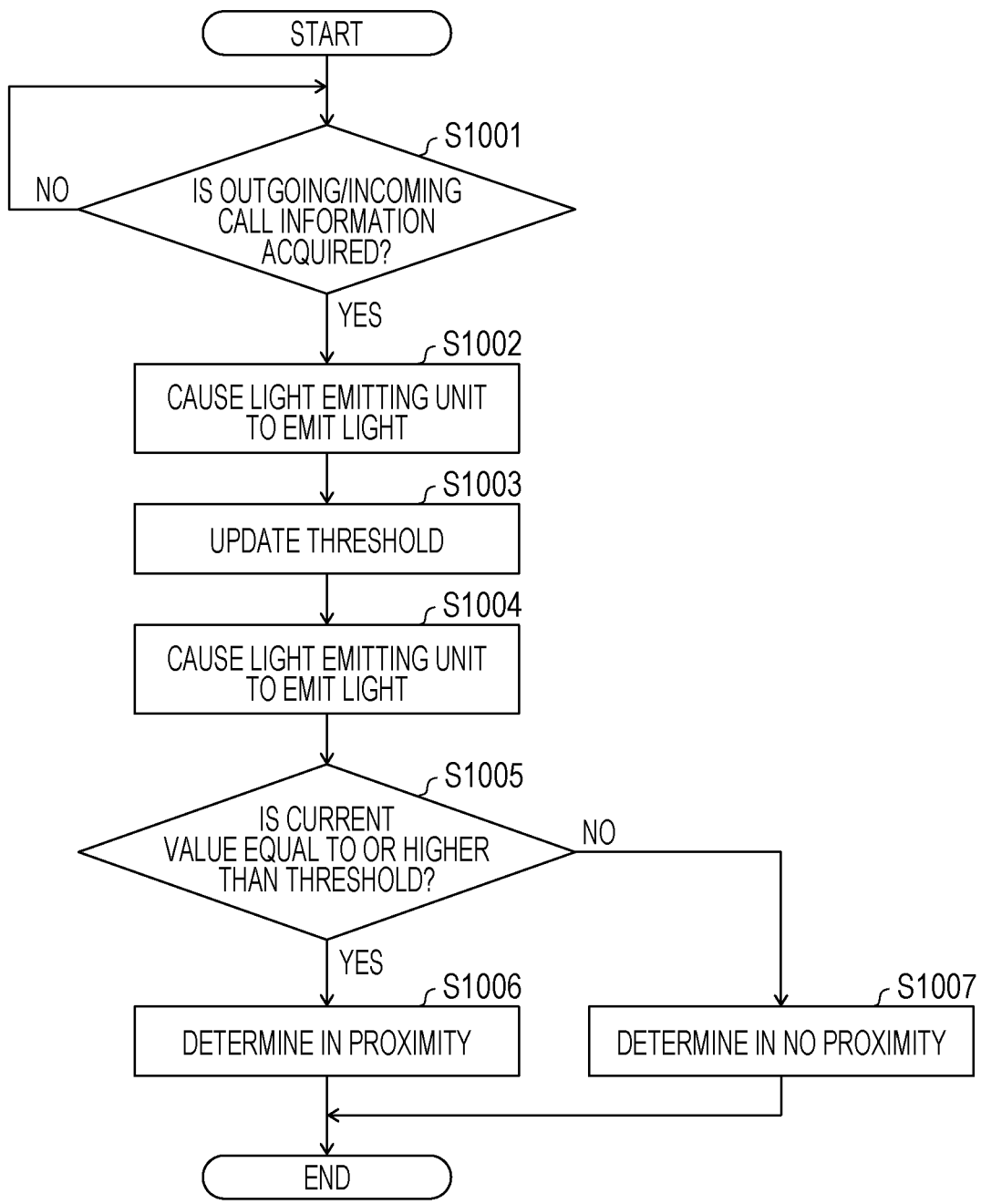
FIG. 11 is a flowchart illustrating an example of a flow of calibration processing of the proximity sensor of the related art.

As illustrated in FIG. 7, in the digital camera 600, any one of the proximity sensor 100 and the proximity illumination intensity sensor 400 that are described above is provided as a proximity sensor 601 at a top of a display unit 602. The digital camera 600 performs switching between on and off of display of the display unit 602 in accordance with a proximity state or a non-proximity state of the object OB. For example, in a case where a user of the digital camera 600 performs image capturing with the digital camera 600 by capturing an image of a subject while checking the display unit 602, a control unit included in the digital camera 600 determines that the state is a non-proximity state and the display unit 602 is turned on. On the other hand, in a case where the user captures an image of the subject while looking into a viewfinder of the digital camera 600, the control unit determines that the state is a proximity state and the display unit 602 is turned off.

As a result, power consumption of the digital camera 600 is able to be reduced. Further, in a case where the display unit 602 has a touch panel function, by turning off the touch panel function in the proximity state, it is possible to prevent an erroneous operation when a face of the user contacts the display unit 602.

By providing the proximity sensor 100 or the proximity illumination intensity sensor 400 as the proximity sensor 601, accuracy of calibration is able to be improved compared to a sensor of the related art. As a result, an erroneous operation of the digital camera 600 is able to be reduced.

In particular, also in a case where characteristics of the proximity sensor 601 change due to change in external temperature, external environment light, or the like particularly in a state where the proximity sensor 601 is continuously operated in the non-proximity state, such as a state where the user does not look into the viewfinder, an output value of the proximity sensor 601 is able to be stabilized by continuing calibration. As a result, an erroneous operation is able to be reduced.

Example of Realization by Software

A control block of the proximity sensor 100 may be realized by a logic circuit (hardware) provided in an integrated circuit (IC chip) or the like or may be realized by software with use of a CPU (Central Processing Unit).

In the case of using software, the proximity sensor 100 includes a CPU that executes a command of a program that is software enabling each of functions, a ROM (read only memory) or a storage device (each referred to as a "storage medium") in which the program and various kinds of data are stored so as to be readable by a computer (or a CPU), a RAM (random access memory) that develops the program, and the like. An object of the invention is achieved by a computer (or a CPU) reading and executing the program from the storage medium. As the storage medium, for example, a "non-transitory tangible medium" such as a tape, a disk, a card, a semiconductor memory, or a programmable logic circuit may be used. The program may be supplied to the computer via any transmission medium (such as a communication network or a broadcast wave) which enables the program to be transmitted. Note that, the invention can also be achieved in a form of a data signal in which the program is embodied through electronic transmission and which is embedded in a carrier wave.

CONCLUSION

A proximity sensor (100) according to an aspect 1 of the invention includes: a light emitting unit (101) that emits light; a light receiving unit (102) that generates measurement current which includes object reflected light current according to a received amount of reflected light that is emitted from the light emitting unit and reflected by a detection target object and non-detection-target-object reflected light current according a received amount of light other than the reflected light; and a first execution unit (initial calibration execution unit 120) that executes first calibration in which an offset value according to a current value of the non-detection-target-object reflected light current is updated on a basis of a current value of the measurement current in a case where the current value of the measurement current is equal to or less than an initial threshold, and the offset value is not updated in a case where the current value of the measurement current is higher than the initial threshold.

According to the aforementioned configuration, the offset value according to the non-detection-target-object reflected light current that is generated by the light receiving unit in accordance with the received amount of the light other than the light reflected by the detection target object is updated through the first calibration in a case where the measurement current value is equal to or less than the initial threshold, and is not updated in a case where the measurement current value is higher than the initial threshold.

Thus, for example, in a case where the initial threshold is set as a value that includes a proximity detection threshold usable for determining proximity and a current value considered to be generated by internal reflection, when the measurement current value generated in the light receiving unit is higher than the initial threshold, the measurement current is considered to be generated when there is a detection target object in proximity. Thus, it is not suitable to use the measurement current for updating the offset value. Accordingly, in a case where the measurement current value is higher than the initial threshold, the offset value is not updated in the first calibration, and thus an appropriate offset value is maintained at all times. In other words, the aforementioned configuration makes it possible to appropriately execute calibration in consideration of the noise floor. As a result, determination of proximity is able to be performed by using the appropriate offset value, and thus proximity is able to be correctly detected.

It is preferable that in the aspect 1 the proximity sensor (100) according to an aspect 2 of the invention includes a second execution unit (constant calibration execution unit 130) that executes second calibration in which a first offset value which is an offset value after the first calibration is executed is updated to a value obtained by averaging the first offset value and a current value of measurement current generated from the light receiving unit after the first calibration is executed.

According to the aforementioned configuration, since the first offset value which is the offset value after the first calibration is executed is updated through the second calibration to the value obtained by averaging the measurement current value and the first offset value, the offset value is able to be set as, for example, a value gradually following the noise floor and external change. This makes it possible to set an accurate offset value.

In the proximity sensor (100) according to an aspect 3 of the invention, it is preferable that in the aspect 2 the first offset value is updated in the second calibration in a case where a correction measurement value obtained by subtracting the first offset value from the current value of the measurement current generated from the light receiving unit after the first calibration is executed is equal to or less than a constant threshold.

According to the aforementioned configuration, for example, in a case where the constant threshold is set as a proximity detection threshold usable for determining proximity, when there is a detection target object in proximity, it is possible that the first offset value is not updated in the second calibration. This makes it possible to appropriately execute the second calibration.

In the proximity sensor (100) according to an aspect 4 of the invention, it is preferable that in the aspect 2 the first calibration and the second calibration are alternately executed, and the first offset value is not updated in the second calibration in a case where a correction measurement value obtained by subtracting the first offset value from the current value of the measurement current generated from the light receiving unit after the first calibration is executed is equal to or less than a lower limit threshold.

According to the aforementioned configuration, for example, in a case where the lower limit threshold is set as a value obtained by subtracting the offset value from the measurement current value (initial measurement current value) during execution of the first calibration, when the first calibration is able to be determined as erroneous calibration, the first calibration is able to be performed again without updating the first offset value in the second calibration. This makes it possible to exclude use of the offset value by erroneous calibration for an output value, and thus higher accuracy of calibration is achieved.

In the proximity sensor (100) according to an aspect 5 of the invention, it is preferable that in the second aspect 2 the first offset value is not updated in the second calibration in a case where change in external light is detected.

According to the aforementioned configuration, in a case where there is change in the external light, the first calibration is able to be performed again without updating the first offset in the second calibration. This makes it possible to perform the first calibration again in consideration of the change in the external light.

It is preferable that in any of the aspects 1 to 5 the proximity sensor (100) according to an aspect 6 of the invention includes an offset value update determination unit (flag determination unit 121) that determines whether or not the offset value has been updated in the first calibration, and the first execution unit updates the offset value in the first calibration in a case where the offset value update determination unit determines that the offset value has not been updated in the first calibration.

According to the aforementioned configuration, since the first calibration is executed in a case where it is determined that the offset value has not been updated in the first calibration, the first calibration and the second calibration are able to be alternately executed.

A proximity sensor (100) calibration method according to an aspect 7 of the invention includes: a light emitting step of emitting light; a light receiving step of generating measurement current which includes object reflected light current according to a received amount of reflected light that is emitted at the light emitting step and reflected by a detection target object and non-detection-target-object reflected light current according a received amount of light other than the reflected light; and a first execution step of executing first calibration in which an offset value according to a current value of the non-detection-target-object reflected light current is updated on a basis of a current value of the measurement current in a case where the current value of the measurement current is equal to or less than an initial threshold, and the offset value is not updated in a case where the current value of the measurement current is higher than the initial threshold.

According to the aforementioned configuration, an effect similar to that of the aspect 1 is exerted.

It is preferable that the proximity sensor (100) calibration method according to an aspect 8 of the invention includes a second execution step of executing second calibration in which a first offset value which is an offset value after the first calibration is executed is updated to a value obtained by averaging the first offset value and a current value of measurement current generated at the light receiving step after the first calibration is executed.

According to the aforementioned configuration, an effect similar to that of the aspect 2 is exerted.

In the proximity sensor (100) calibration method according to an aspect 9 of the invention, it is preferable that in the aspect 8 the first offset value is updated in the second calibration in a case where a correction measurement value obtained by subtracting the first offset value from the current value of the measurement current generated at the light receiving step after the first calibration is executed is equal to or less than a constant threshold.

According to the aforementioned configuration, an effect similar to that of the aspect 3 is exerted.

In the proximity sensor (100) calibration method according to an aspect 10 of the invention, it is preferable that in the aspect 8 the first calibration and the second calibration are alternately executed, and the first offset value is not updated in the second calibration in a case where a correction measurement value obtained by subtracting the first offset value from the current value of the measurement current generated at the light receiving step after the first calibration is executed is equal to or less than a lower limit threshold.

According to the aforementioned configuration, an effect similar to that of the aspect 4 is exerted.

In the proximity sensor (100) calibration method according to an aspect 11 of the invention, it is preferable that in the aspect 8 the first offset value is not updated in the second calibration in a case where change in external light is detected.

According to the aforementioned configuration, an effect similar to that of the aspect 5 is exerted.

It is preferable that in any of the aspects 7 to 11 the proximity sensor (100) calibration method according to an aspect 12 of the invention includes an offset value update determination step of determining whether or not the offset value has been updated in the first calibration, and in a case where it is determined at the offset value update determination step that the offset value has not been updated in the first calibration, the offset value is updated in the first calibration at the first execution step.

According to the aforementioned configuration, an effect similar to that of the aspect 6 is exerted.

In the proximity illumination intensity sensor (400) according to an aspect 13 of the invention, it is preferable that, in the proximity sensor (100) according to any one of the aspects 1 to 6, the light receiving unit (402) receives external light, generates current according to an amount of received light, and thereby detects illumination intensity of the external light.

According to the aforementioned configuration, the proximity illumination intensity sensor that exerts an effect similar to that of the aspect 1 is able to be enabled.

It is preferable that an electronic device (mobile phone 500, digital camera 600) according to an aspect 14 of the invention includes the proximity sensor (100) according to any of the aspects 1 to 6 or the proximity illumination intensity sensor (400) according to the aspect 13.

According to the aforementioned configuration, an electronic device that exerts an effect similar to that of the aspect 1 is able to be realized.

The proximity sensor according to each aspect of the invention may be enabled by a computer, and in such case, a control program for the proximity sensor that causes the proximity sensor to be realized by a computer by causing the computer to operate as each unit (software element) of the proximity sensor, and a computer-readable storage medium having the control program stored therein are also included in the scope of the invention.

The invention is not limited to each of the embodiments described above, and may be modified in various manners within the scope indicated in the claims and an embodiment achieved by appropriately combining technical means disclosed in different embodiments is also encompassed in the technical scope of the invention. Further, by combining the technical means disclosed in each of the embodiments, a new technical feature may be formed.

REFERENCE SIGNS LIST 100 proximity sensor
101, 401 light emitting unit
102, 402 light receiving unit
120, 420 initial calibration execution unit (first execution unit)
121 flag determination unit (offset value update determination unit)
130, 430 constant calibration execution unit (second execution unit)
400 proximity illumination intensity sensor
500 mobile phone (electronic device)
600 digital camera (electronic device)

The invention claimed is:

1. A proximity sensor comprising:
a light emitting unit that emits light;
a light receiving unit that generates measurement current which includes object reflected light current according to a received amount of reflected light that is emitted from the light emitting unit and reflected by a detection target object and non-detection-target-object reflected light current according a received amount of light other than the reflected light; and
a first execution unit that executes first calibration in which an offset value according to a current value of the non-detection-target-object reflected light current is updated on a basis of a current value of the measurement current in a case where the current value of the measurement current is equal to or less than an initial threshold, and the offset value is not updated in a case where the current value of the measurement current is higher than the initial threshold.

2. The proximity sensor according to claim 1, further comprising a second execution unit that executes second calibration in which a first offset value which is an offset value after the first calibration is executed is updated to a value obtained by averaging the first offset value and a current value of measurement current generated from the light receiving unit after the first calibration is executed.

3. The proximity sensor according to claim 2, wherein the first offset value is updated in the second calibration in a case where a correction measurement value obtained by subtracting the first offset value from the current value of the measurement current generated from the light receiving unit after the first calibration is executed is equal to or less than a constant threshold.

4. The proximity sensor according to claim 2, wherein
the first calibration and the second calibration are alternately executed, and
the first offset value is not updated in the second calibration in a case where a correction measurement value obtained by subtracting the first offset value from the current value of the measurement current generated from the light receiving unit after the first calibration is executed is equal to or less than a lower limit threshold.

5. The proximity sensor according to claim 2, wherein the first offset value is not updated in the second calibration in a case where change in external light is detected.

6. The proximity sensor according to claim 1, further comprising
an offset value update determination unit that determines whether or not the offset value has been updated in the first calibration, wherein
the first execution unit updates the offset value in the first calibration in a case where the offset value update determination unit determines that the offset value has not been updated in the first calibration.

7. A proximity sensor calibration method comprising:
a light emitting step of emitting light;
a light receiving step of generating measurement current which includes object reflected light current according to a received amount of reflected light that is emitted at the light emitting step and reflected by a detection target object and non-detection-target-object reflected light current according a received amount of light other than the reflected light; and
a first execution step of executing first calibration in which an offset value according to a current value of the non-detection-target-object reflected light current is updated on a basis of a current value of the measurement current in a case where the current value of the measurement current is equal to or less than an initial threshold, and the offset value is not updated in a case where the current value of the measurement current is higher than the initial threshold.

8. The proximity sensor calibration method according to claim 7, further comprising a second execution step of executing second calibration in which a first offset value which is an offset value after the first calibration is executed is updated to a value obtained by averaging the first offset value and a current value of measurement current generated at the light receiving step after the first calibration is executed.

9. The proximity sensor calibration method according to claim 8, wherein the first offset value is updated in the second calibration in a case where a correction measurement value obtained by subtracting the first offset value from the current value of the measurement current generated at the light receiving step after the first calibration is executed is equal to or less than a constant threshold.

10. The proximity sensor calibration method according to claim 8, wherein the first calibration and the second calibration are alternately executed, and the first offset value is not updated in the second calibration in a case where a correction measurement value obtained by subtracting the first offset value from the current value of the measurement current generated at the light receiving step after the first calibration is executed is equal to or less than a lower limit threshold.

11. The proximity sensor calibration method according to claim 8, wherein the first offset value is not updated in the second calibration in a case where change in external light is detected.

12. The proximity sensor calibration method according to claim 7, further comprising an offset value update determination step of determining whether or not the offset value has been updated in the first calibration, wherein the offset value is updated in the first calibration at the first execution step in a case where it is determined at the offset value update determination step that the offset value has not been updated in the first calibration.

13. A proximity illumination intensity sensor, wherein in the proximity sensor according to claim 1, the light receiving unit receives external light, generates current according to an amount of received light, and thereby detects illumination intensity of the external light.

14. An electronic device comprising the proximity sensor according to claim 1.

15. An electronic device comprising the proximity illumination intensity sensor according to claim 13.

* * * * *